United States Patent
Rhodes et al.

(10) Patent No.: US 6,605,901 B1
(45) Date of Patent: Aug. 12, 2003

(54) APPARATUS AND METHOD FOR ELECTRICAL INSULATION IN PLASMA DISCHARGE SYSTEMS

(75) Inventors: Mark A. Rhodes, Redwood City, CA (US); Scott N. Fochs, Livermore, CA (US)

(73) Assignee: The United States of America as represented by the Department of Energy, Washington, DC (US)

( * ) Notice: Subject to any disclaimer, the term of this patent is extended or adjusted under 35 U.S.C. 154(b) by 0 days.

(21) Appl. No.: 10/038,386

(22) Filed: Jan. 3, 2002

Related U.S. Application Data

(60) Provisional application No. 60/259,696, filed on Jan. 4, 2001.

(51) Int. Cl.[7] .................................................. H01J 7/24
(52) U.S. Cl. ............................. 315/111.71; 315/111.21; 315/337; 315/169.1
(58) Field of Search ........................ 315/111.21, 111.31, 315/111.71, 300, 337, 169.1; 250/423 R, 424; 313/231.31

(56) References Cited

U.S. PATENT DOCUMENTS

| | | | |
|---|---|---|---|
| 4,025,818 A | * | 5/1977 | Giguere et al. ............. 315/337 |
| 5,355,764 A | * | 10/1994 | Marinos et al. .................. 89/8 |
| 6,313,587 B1 | * | 11/2001 | MacLennan et al. ........ 315/248 |
| 6,388,381 B2 | * | 5/2002 | Anders ................... 315/111.21 |
| 6,452,194 B2 | * | 9/2002 | Bijkerk et al. ........... 250/492.2 |

* cited by examiner

*Primary Examiner*—Haissa Philogene
(74) *Attorney, Agent, or Firm*—William C. Daubenspeck; Paul A. Gottlieb

(57) ABSTRACT

An apparatus and method to contain plasma at optimal fill capacity of a metallic container is disclosed. The invention includes the utilization of anodized layers forming the internal surfaces of the container volume. Bias resistors are calibrated to provide constant current at variable voltage conditions. By choosing the appropriate values of the bias resistors, the voltages of the metallic container relative to the voltage of an anode are adjusted to achieve optimal plasma fill while minimizing the chance of reaching the breakdown voltage of the anodized layer.

22 Claims, 2 Drawing Sheets

APPARATUS AND METHOD FOR ELECTRICAL INSULATION IN PLASMA DISCHARGE SYSTEMS

CROSS-REFERENCE TO RELATED APPLICATIONS

This Application claims priority from Provisional Patent Application 60/259,696, entitled "Apparatus and Method for Electrical Insulation in Plasma Discharge Systems", filed Jan. 5, 2001.

The United States Government has rights in this invention pursuant to Contract No. W-7405-ENG-48 between the United States Department of Energy and the University of California for management and operation of the Lawrence Livermore National Laboratory.

FIELD OF THE INVENTION

The present invention generally relates to apparatus and method for insulation in plasma discharge systems. Specifically, the invention pertains to a structure and method in which a conductive confinement is implemented to contain a plasma discharge at optimal fill volume and with the least insulation breakdown. More specifically, the invention provides a method of applying an anodized insulation layer on the surface of the conductive confinement to prevent shorting of and interference with the plasma discharge formed and maintained between a pair of widely separated anode and cathode terminals. A plurality of bias resistors are implemented, to provide optimization of the potentials between the conductive confinement and the anode, in order to promote best plasma fill with a substantially reduced risk of insulation breakdown.

BACKGROUND OF THE INVENTION

Generally, plasma is defined as a mixture composed of neutral particles, ions and electrons. In a plasma mass there is no net space charge and the composition of a plasma mass is a function of temperature and pressure. Specifically, as the temperature of a plasma mass is increased the electrical conductivity increases also.

Plasma generation is well-known in the art. Conventional plasma generation systems utilize an anode and cathode terminals with spatial separation therebetween. A power source supplies electrical energy to the terminals and generally a sacrificial fuse is evaporated/consumed to generate highly ionized plasma between the terminals.

The prior art method for producing plasma inside a container is to drive electric current between a pair of electrodes mounted in the container. The interior is preferably filled with helium, equivalent gas or mixture of gases maintained at below the atmospheric pressure. To maintain the flow of electric current through the contained gas, there must be a potential difference (voltage) between the discharge electrodes. This voltage is typically maintained by a high-voltage power supply or radio frequency (RF) power supply. If the container is made of a dielectric substance such as glass or insulation material, the required voltage difference is easily maintained even if the discharge electrodes are widely separated. However, for some applications, dielectric substances such as glass are unsuited for plasma containment because of breakage, cost or other mechanical and fabrication problems. For these applications, metallic containers are best suited. However, metallic containers because of their conductivity tend to interfere with the formation and fill-volume of plasma contained therein.

Specifically, while generating plasma does not pose significant technical difficulties, the containment of plasma in metallic vessels requires highly specialized equipment. More specifically, plasma appears to have unpredictable hydrodynamic and electrical properties when placed in metallic containers.

Accordingly, it would be preferable to use metallic vessels provided direct contact between the stored plasma and the metallic walls of the container is avoided.

SUMMARY OF THE INVENTION

The present invention provides a device and method for containing a plasma discharge in a substantially conductive container. Specifically, the invention discloses a structure and method to optimally fill the container with plasma discharge without the associated problems of electrical shorting of the plasma by the conductive container.

It is the object of the present invention to provide a structure to contain plasma discharge within a container at best fill capacity of the container and minimum dielectric breakdown. In significant parts, the invention includes a plasma discharge containment chamber in a structure having an inner and outer surfaces. Specifically, cathode and anode terminals are interstitially disposed and supported at the inner surface of the containment chamber. Further, a dielectric layer forms an epidermic cover on the inner surface. A power source is also connected to the anode and cathode terminals to provide a plasma discharge source. Further, ballast type resistors are connected to the power source. The resistors are connected to the outer surface of the container and the anode terminal. These connections generally provide the basic architecture for operable electrical connections to the cathode terminal via the power source to confine the plasma discharge at optimal space-volume capacity of the containment chamber.

It is another object of the invention to provide a device to optimize container and anode potentials for best plasma fill of the container while attenuating insulation breakdown. Significant elements of the structure include the container forming an enclosed structure; an anode and a cathode terminals attached to internal surfaces of the container; a power source connected to the cathode terminal and a first and second bias resistors connected to the power source. The internal surfaces are generally formed from an anodized layer applied to the container and the first bias resistor is preferably connected between a positive terminal of the power source and the container. Further, the second bias resistor is connected between the positive terminal of the power source and the anode terminal.

It is yet another object of the invention to provide a method for electrical insulation in plasma discharge containers, to maintain the plasma discharge at best fill capacity of the container and minimum dielectric breakdown. In general, the method includes providing a plasma discharge containment chamber having an inner and outer surfaces; coating the inner surface to form an anodized layer therein; placing a cathode and anode terminals in a spaced-apart relations therewith on the inner surface of the container; providing a power source with a negative and positive terminals having operable electrical connections with the cathode terminal on the negative side and with a plurality of bias resistors on the positive side. Further, the preferred method includes the further steps of connecting one of the plurality of bias resistors to the outer surface of the container; connecting another one of the plurality of bias resistors to the anode terminal and controlling voltage across the inner and outer surfaces by choosing appropriate values for the plurality of bias resistors.

The above features and advantages of the present invention will become apparent upon consideration of the following detailed description of several specific embodiments thereof, especially when taken in conjunction with the accompanying drawings.

DESCRIPTION OF THE PREFERRED EMBODIMENT

The present invention advantageously provides plasma discharge containment in a vessel of arbitrary shape. The interior of the vessel is preferably coated with aluminum oxide or equivalent using an anodization process. Discharge electrodes are mounted internally and are insulated from the vessel. The anodized layer provides electrical insulation to the plasma from the vessel. Further, a plurality of bias resistors are used to provide a constant current and further enable to maintain voltage under the breakdown level of the insulator to ensure plasma distribution within the optimal fill volume of the vessel.

Figure 1:
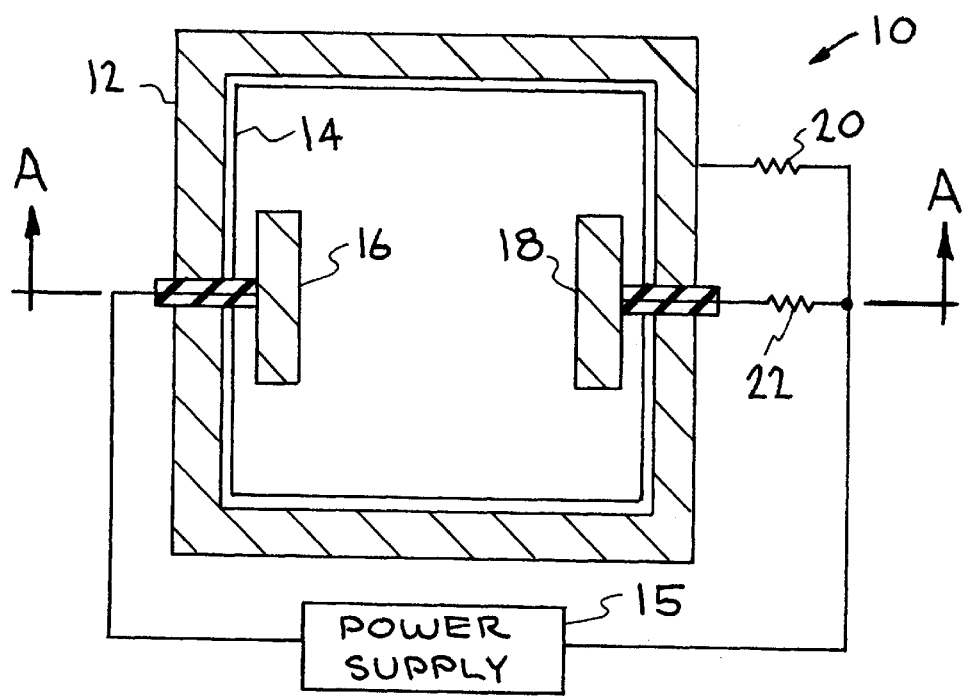
FIG. 1 is a combination of a sectional view of the container and a schematic of the wiring diagram.

Referring to FIG. 1, a more detailed aspect of the invention is shown. Specifically, device 10 includes metallic housing 12 forming a substrate of anodized layer 14. Anodized layer 14 forms a major portion of the internal walls. Power supply 15 is connected to cathode 16 and anode 18. The connection with power supply 15 further includes housing bias resistor 20 and anode bias resistor 22.

Figure 2:
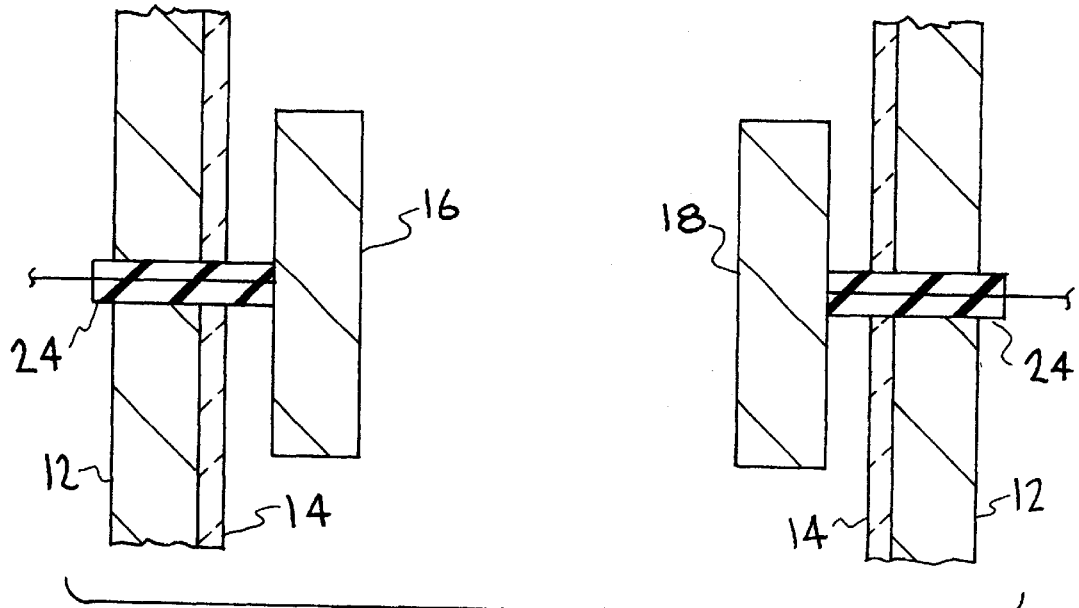
FIG. 2 is a section view about A—A representing the mounting structure for the anode and cathode terminals.

FIG. 2 is a detail representation of the mount of cathode 16 and anode 18 against anodized layer 14. Insulating spacers 24 are used to isolate cathode 16 and anode 18.

Figure 3:
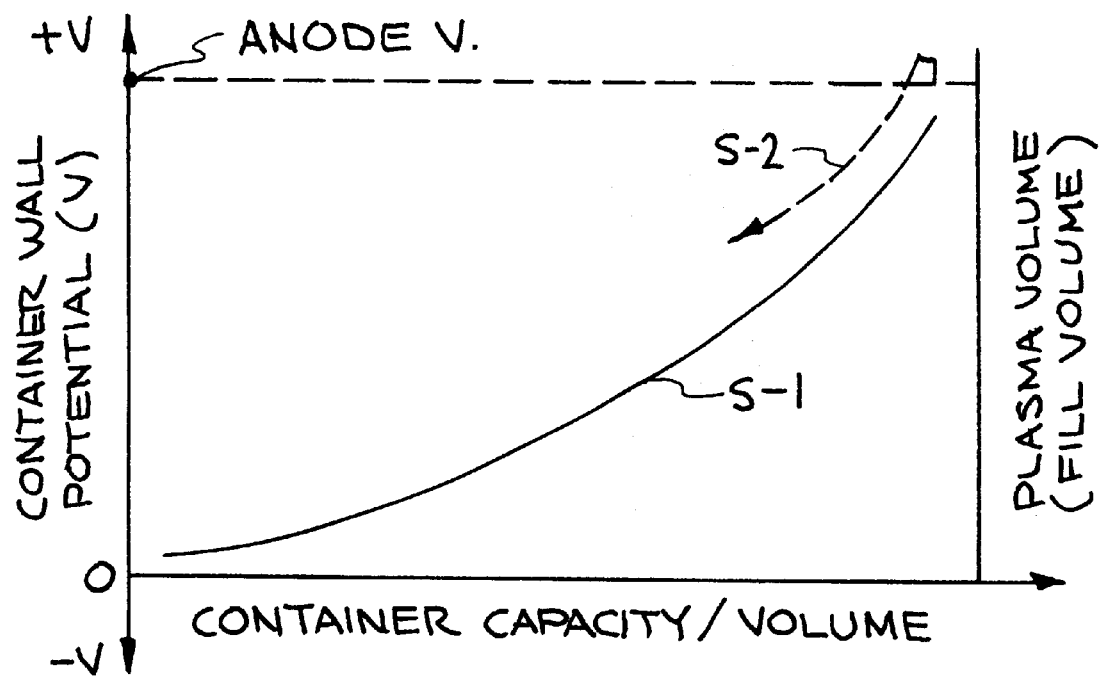
FIG. 3 is a graphical representation of the relationship between the container capacity, plasma volume, the container potential and the anode terminal voltage.

FIG. 3 is a graphical depiction of the relationship between the voltage potential for metallic housing 12, the containment volume of the space defined by anodized layer 14, the volume and distribution of the plasma discharge and the voltage at anode 18. Generally, the chart shows that plasma discharge distribution and fill volume is dependent on the container wall potential or voltage. Further, the chart shows that a critical element in keeping an optimal plasma fill volume in a conductive container is to keep the container wall voltage under the anode voltage to prevent breakdown. It should be noted that the inner surface of the container, which has a direct contact with the plasma discharge, is presumed to have been treated with the anodized layer in the manner of the present invention.

In operation, the present invention is well-suited for applications that require plasma discharge containment within a conductive container. Applications that favor conductive or metallic containers include plasma-electrode Pockels cells and similar systems. In general, metallic housing 12 may be connected to any node in the discharge circuit or could be left to float. Clearly, the alternate connection points comprise of cathode terminal 16 and anode terminal 18. If metallic housing 12 is connected to cathode terminal 16 electrons will be repelled away from anodized layer 14. This minimizes the chance of current flowing to the anodized layer 14 instead of to anode terminal 18.

However, experimental observation and analysis based on the present invention have shown that plasma is repelled from anodized layer 14 by biasing cathode terminal 16. This is particularly because of a resultant force on the plasma due to the combined action of the magnetic field from the plasma current and the electric field existing between the plasma and the anodized layer 14. As depicted in FIG. 3, plasma volumetric distribution or fill improves as the container wall potential becomes more positive as shown under curve S-1. However, if the container wall voltage potential is set more positive than anode terminal 18 the thin anodized layer 14 breaks down and acts as a discharging capacitor thereby releasing current into metallic housing 12 instead of anode terminal 18. This observation is depicted by curve S-2 where the voltage breakdown of anodized layer 14 is shown to effectively decrease plasma fill volume. Accordingly, the observation indicates that anodized layer 14 is electrically leaky. This means that some current is collected by metallic housing 12.

Realizing this, the plasma discharge circuit shown in FIG. 3 includes a bias resistor 22 between the positive terminal of power supply 15 and anode terminal 18. Further, bias resistor 20 is implemented between the positive terminal of power supply 15 and metallic housing 12. Bias resistors 18 and 20 are used as ballast resistors. Ballast resistors regulate or control current flow under changing voltage conditions. Bias resistors 18 and 20 provide a constant current by adjusting the voltage drop against the input voltage. The greater the input voltage, the larger the voltage drop across bias resistors 18 and 20 and the flow of current remains nearly constant. Thus, by choosing the appropriate values of bias resistors 18 and 20, the voltage of metallic housing 12 relative to anode 18 can be adjusted to achieve optimal plasma fill while minimizing the chance of reaching or exceeding the breakdown voltage of anodized layer 14.

While the preferred embodiment of the present invention have been shown and described, it will be obvious to those skilled in the art that changes, variations and modifications may be made therein without departing from the present invention in its broader aspects. Therefore, the above descriptions should not be taken as limiting the scope of the present invention which is defined by the appended claims.

What is claimed is:

1. A structure to contain plasma discharge within a container at best fill capacity of the container and minimum dielectric breakdown, the structure comprising:

a plasma discharge containment chamber in the structure having an inner and outer surfaces;

cathode and anode terminals interstitially disposed and supported at said inner surface of said containment chamber;

a dielectric layer forming an epidermic cover on said inner surface;

a power source connected to said anode and cathode to provide a plasma discharge source; and a plurality of resistors connected to said power source; said plurality of resistors having connections to said outer surface and said anode terminal and further having operable electrical connections to said cathode terminal via said power source to thereby confine the plasma discharge at optimal space-volume capacity of said containment chamber.

2. The structure of claim 1 wherein said epidermic cover includes a thin layer of insulation.

3. The structure of claim 2 wherein said insulation includes an anodized layer.

4. The structure of claim 2 wherein said anodized layer includes aluminum oxide.

5. The structure of claim 1 wherein said plurality of resistors include bias resistors adjustable to set potentials (voltages) for said container and said anode terminal.

6. The structure of claim 1 wherein said connection to said outer surface includes operable electrical contact with a conductive substrate of said containment chamber.

7. A device to optimize container and anode potentials for best plasma fill of a container while attenuating insulation breakdown, the device comprising:

the container forming an enclosed structure;

an anode terminal and a cathode terminal attached to internal surfaces of the container;

a power source connected to the cathode terminal; and first and second bias resistors connected to the power source;

said internal surfaces being formed from an anodized layer applied to the container and said first bias resistor being connected between a positive terminal of said power source and the container and further said second bias resistor being connected between said positive terminal of the power source and said anode terminal.

8. The device of claim 7 wherein said first bias resistor is connected to provide a constant current to said container.

9. The device of claim 8 wherein said first bias resistor is connected to an electrically conductive substrate of said container.

10. The device of claim 7 wherein said second bias resistor is connected to provide a constant current to said anode terminal.

11. The device of claim 7 wherein said anodized layer includes aluminum oxide coat.

12. The device of claim 7 wherein a dielectric spacer is implemented to insulate said cathode and anode terminals from said container.

13. The device of claim 7 wherein said container forming the enclosed structure includes a metallic substrate.

14. The device of claim 7 wherein said first and second resistors are structured to provide adjustable potential (V) to said container and said anode terminal, respectively.

15. A method for electrical insulation in plasma discharge containers, to maintain the plasma discharge at best fill capacity of the container and minimum dielectric breakdown, comprising the device-implemented steps of:

providing a plasma discharge containment chamber having an inner and outer surfaces;

coating said inner surface to form an anodized layer therein;

placing a cathode and anode terminals in a spaced-apart relations therewith on said inner surface of said container;

providing a power source with a negative and positive terminals having operable electrical connections with said cathode terminal on the negative side and with a plurality of bias resistors on the positive side;

connecting one of said plurality of bias resistors to said outer surface of the container;

connecting another one of said plurality of bias resistors to said anode terminal; and controlling voltage across said inner and outer surfaces by choosing appropriate values for said plurality of bias resistors.

16. The method according to claim 15 wherein said outer surface is structured to form a metallic substrate.

17. The method according to claim 15 wherein said step of connecting said plurality of bias resistors includes increasing the positive voltage potential of the container.

18. The method according to claim 15 wherein said step of placing said cathode and anode terminals includes the further step of installing dielectric spacers to insulate each of said terminals from said inner surface.

19. The method according to claim 15 wherein said step of controlling voltage include the further step of setting the container's potential less positive than the potential at said anode terminal.

20. The method according to claim 19 wherein said step of setting includes varying the resistance of said plurality of bias resistors to maintain a constant current.

21. The method according to claim 19 wherein said step of controlling voltage includes preventing voltage breakdown of said anodized layer.

22. The method according to claim 15 wherein the volume of plasma is distributed at a fill capacity of said container by maintaining current collection in said anodized layer just under voltage breakdown of said anodized layer.

* * * * *